United States Patent
Kumazawa

(10) Patent No.: US 9,649,775 B2
(45) Date of Patent: May 16, 2017

(54) WORKPIECE DIVIDING METHOD

(71) Applicant: Disco Corporation, Tokyo (JP)

(72) Inventor: Satoshi Kumazawa, Tokyo (JP)

(73) Assignee: Disco Corporation, Tokyo (JP)

( * ) Notice: Subject to any disclaimer, the term of this patent is extended or adjusted under 35 U.S.C. 154(b) by 149 days.

(21) Appl. No.: 13/871,125

(22) Filed: Apr. 26, 2013

(65) Prior Publication Data

US 2013/0298744 A1   Nov. 14, 2013

(30) Foreign Application Priority Data

May 9, 2012 (JP) ................................ 2012-107974

(51) Int. Cl.

| | |
|---|---|
| *B26D 9/00* | (2006.01) |
| *B23K 26/42* | (2006.01) |
| *B23K 26/36* | (2014.01) |
| *B23K 26/00* | (2014.01) |
| *B23K 26/364* | (2014.01) |
| *B23K 26/60* | (2014.01) |
| *B23K 26/40* | (2014.01) |
| *H01L 33/00* | (2010.01) |
| *B23K 103/00* | (2006.01) |

(52) U.S. Cl.
CPC ............ *B26D 9/00* (2013.01); *B23K 26/0093* (2013.01); *B23K 26/364* (2015.10); *B23K 26/40* (2013.01); *B23K 26/60* (2015.10); *B23K 2203/50* (2015.10); *H01L 33/0095* (2013.01); *Y10T 83/0215* (2015.04)

(58) Field of Classification Search
CPC ...... B23K 26/364; B23K 26/40; B23K 26/60; B23K 26/0093; B23K 203/50; B26D 9/00; Y10T 83/0215; H01L 33/0095

USPC ............................. 83/863–887; 438/460–465
See application file for complete search history.

(56) References Cited

U.S. PATENT DOCUMENTS

| | | | | |
|---|---|---|---|---|
| 6,271,102 | B1 * | 8/2001 | Brouillette et al. | 438/462 |
| 6,357,330 | B1 * | 3/2002 | Dass et al. | 83/863 |
| 6,827,636 | B2 * | 12/2004 | Yamada | 451/65 |
| 7,183,007 | B2 * | 2/2007 | Yamamoto | 428/500 |
| 7,517,423 | B2 * | 4/2009 | Furui et al. | 156/272.8 |
| 8,584,561 | B2 * | 11/2013 | Sugiyama et al. | 83/13 |
| 9,034,731 | B2 * | 5/2015 | Park | B23K 26/4075 257/E21.001 |
| 2001/0045366 | A1 * | 11/2001 | Iwata et al. | 205/665 |
| 2002/0139235 | A1 * | 10/2002 | Nordin et al. | 83/886 |

(Continued)

FOREIGN PATENT DOCUMENTS

JP          10-305420          11/1998

*Primary Examiner* — Omar Flores Sanchez

(74) *Attorney, Agent, or Firm* — Greer Burns & Crain Ltd.

(57) ABSTRACT

A workpiece dividing method for dividing a platelike workpiece into a plurality of individual chips. The workpiece dividing method includes a workpiece preparing step of preparing the platelike workpiece, at least one side of the workpiece being formed as a mat surface, a holding step of holding the workpiece on a holding surface of a chuck table in the condition where the mat surface of the workpiece is exposed, a cut groove forming step of cutting the mat surface of the workpiece held on the holding surface of the chuck table by using a cutting blade to thereby form a cut groove with a remaining portion, and a laser cutting step of applying a laser beam to the workpiece along the cut groove to thereby cut the remaining portion.

2 Claims, 3 Drawing Sheets

(56) References Cited

U.S. PATENT DOCUMENTS

| | | | |
|---|---|---|---|
| 2005/0013926 A1* | 1/2005 | Rutkowski et al. | 427/8 |
| 2006/0084241 A1* | 4/2006 | Chin et al. | 438/460 |
| 2006/0157191 A1* | 7/2006 | Matsuo et al. | 156/272.8 |
| 2007/0105345 A1* | 5/2007 | Kurosawa | H01L 21/78 438/460 |
| 2008/0108262 A1* | 5/2008 | Asai | B26F 3/004 442/1 |
| 2010/0081255 A1* | 4/2010 | Poonjolai | B28D 5/0011 438/462 |
| 2010/0194011 A1* | 8/2010 | Chang et al. | 269/20 |
| 2012/0242814 A1* | 9/2012 | Kubala et al. | 348/76 |
| 2012/0295061 A1* | 11/2012 | Bunker et al. | 428/137 |
| 2013/0273717 A1* | 10/2013 | Hwang et al. | 438/463 |
| 2014/0022643 A1* | 1/2014 | Hirokubo | 359/578 |
| 2014/0083986 A1* | 3/2014 | Zhang | B23K 26/0087 219/121.69 |

* cited by examiner

WORKPIECE DIVIDING METHOD

BACKGROUND OF THE INVENTION

Field of the Invention

The present invention relates to a workpiece dividing method.

Description of the Related Art

A wafer having semiconductor devices such as ICs and LSIs or optical devices such as LDs and LEDs formed on the front side is divided by applying a laser beam along division lines with a laser processing apparatus to form laser processed grooves on the front sides of the wafer, thereby obtaining individual devices to be used as memories, CPUs, LEDs, etc. (see Japanese Patent Laid-Open No. Hei 10-305420, for example). Such a method using a laser beam to form a laser processed groove has an advantage such that the width of an area to be processed in dividing the wafer can be reduced as compared with the case of cutting the wafer by using a cutting blade. Accordingly, in the case of manufacturing a device chip having a small size, it is possible to increase the number of chips that can be produced from one wafer as a workpiece.

SUMMARY OF THE INVENTION

However, in the case of applying a laser beam to the workpiece to form a laser processed groove on the front side of the workpiece, debris as fused matter generated from the workpiece by the laser beam is deposited on the opposite sides of the laser processed groove according to the amount of removal from the workpiece by the laser beam. For example, in the case of forming a deep groove by applying a laser beam to divide the workpiece, the amount of debris generated is increased, so that the width of debris deposited on the front side of the workpiece is also increased. As a result, it may not be possible to sufficiently obtain the advantage that the width of an area to be divided by laser processing can be reduced.

It is therefore an object of the present invention to provide a workpiece dividing method which can reduce the width of an area to be processed in dividing the workpiece.

In accordance with an aspect of the present invention, there is provided a workpiece dividing method for dividing a platelike workpiece into a plurality of individual chips, the workpiece dividing method including a workpiece preparing step of preparing the platelike workpiece, at least one side of the workpiece being formed as a mat surface; a holding step of holding the workpiece on a holding surface of a chuck table in the condition where the mat surface of the workpiece is exposed; a cut groove forming step of cutting the mat surface of the workpiece held on the holding surface of the chuck table by using a cutting blade to thereby form a cut groove with a remaining portion having a predetermined thickness measured from the back side of the workpiece; and a laser cutting step of applying a laser beam having an absorption wavelength to the workpiece along the cut groove formed by the cut groove forming step to thereby cut the remaining portion; whereby chipping occurring in cutting the front side of the workpiece by using the cutting blade is suppressed by the mat surface; and debris generated in the laser cutting step is accommodated in the cut groove to suppress the exposure of the debris to the front side of the workpiece.

Preferably, the surface roughness Ra of the mat surface of the workpiece is set in the range of 0.5 to 5.0 μm.

As described above, the workpiece dividing method according to the present invention is a method of dividing a platelike workpiece into a plurality of individual chips, and this method includes a workpiece preparing step of preparing the platelike workpiece, at least one side of the workpiece being formed as a mat surface, a holding step of holding the workpiece on a holding surface of a chuck table in the condition where the mat surface of the workpiece is exposed, a cut groove forming step of cutting the mat surface of the workpiece held on the holding surface of the chuck table by using a cutting blade to thereby form a cut groove with a remaining portion having a predetermined thickness measured from the back side of the workpiece, and a laser cutting step of applying a laser beam having an absorption wavelength to the workpiece along the cut groove formed by the cut groove forming step to thereby cut the remaining portion. Accordingly, chipping occurring in cutting the front side of the workpiece by using the cutting blade is suppressed by the mat surface. Further, debris generated in the laser cutting step is accommodated in the cut groove to suppress the exposure of the debris to the front side of the workpiece.

The workpiece dividing method according to the present invention can exhibit an effect that the width of an area to be processed in dividing the workpiece can be reduced.

The above and other objects, features and advantages of the present invention and the manner of realizing them will become more apparent, and the invention itself will best be understood from a study of the following description and appended claims with reference to the attached drawings showing some preferred embodiment of the invention.

DETAILED DESCRIPTION OF THE PREFERRED EMBODIMENT

A workpiece dividing method according to a preferred embodiment of the present invention will now be described in detail with reference to the drawings. The present invention is not limited to this preferred embodiment. The composing elements in this preferred embodiment may include those that can be easily assumed by persons skilled in the art or substantially the same as those known in the art.

Figure 1:
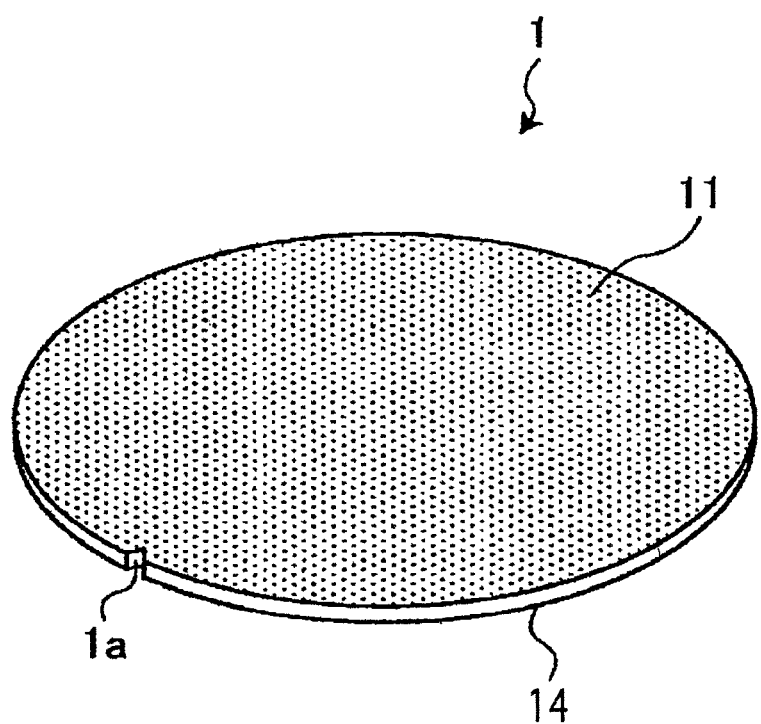
FIG. 1 is a perspective view of a workpiece to be divided by a workpiece dividing method according to a preferred embodiment of the present invention.
Figure 2:
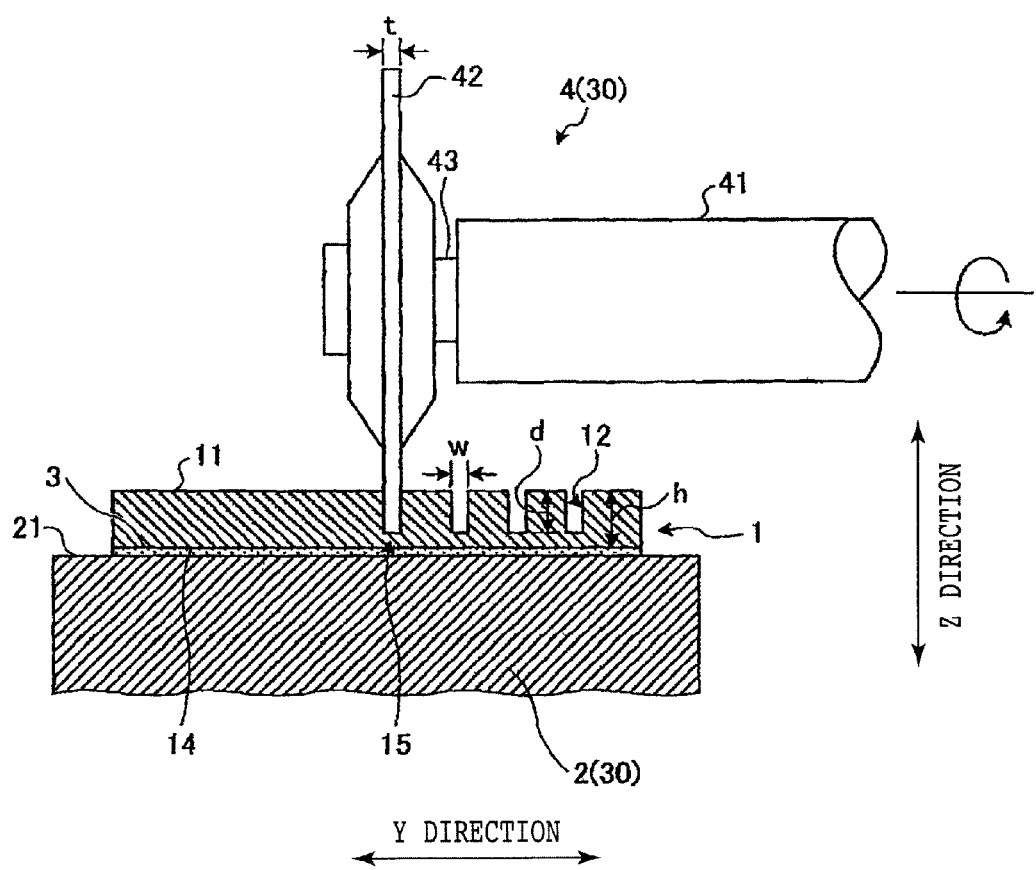
FIG. 2 is a sectional side view for illustrating a cut groove forming step in the workpiece dividing method according to the preferred embodiment.
Figure 3:
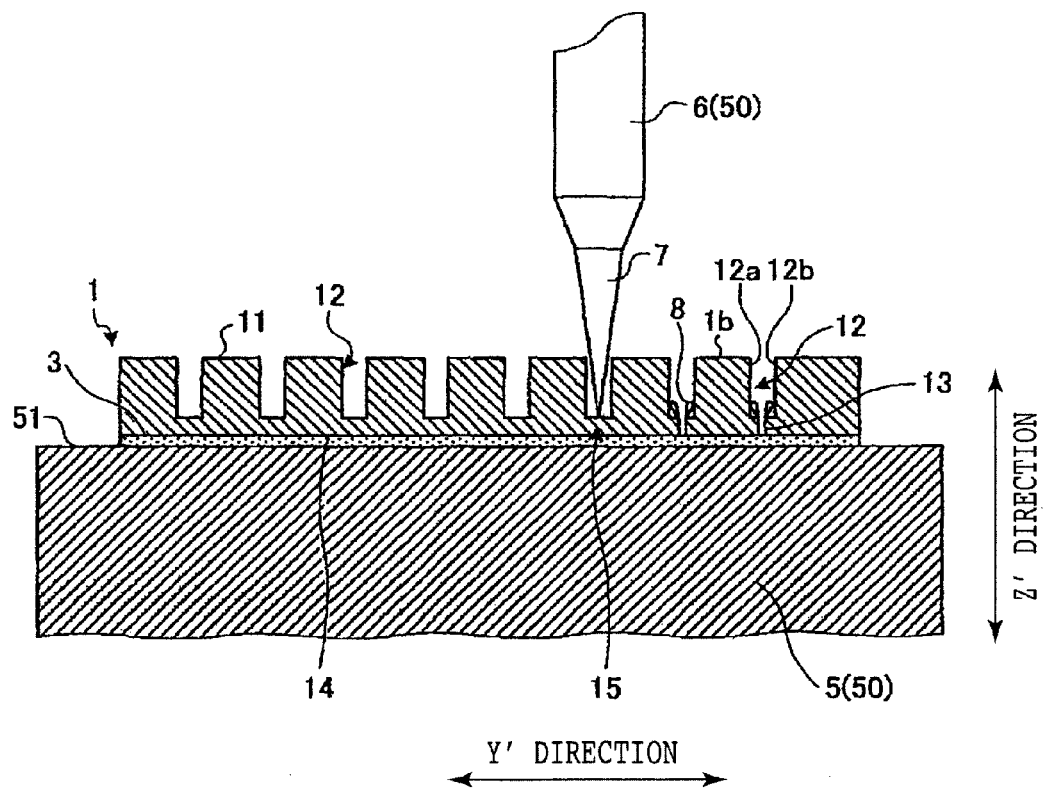
FIG. 3 is a sectional side view for illustrating a laser cutting step in the workpiece dividing method according to the preferred embodiment.

The preferred embodiment will now be described with reference to FIGS. 1 to 3. The preferred embodiment relates to a workpiece dividing method. FIG. 1 is a perspective view of a workpiece 1 to be divided by the workpiece dividing method according to the preferred embodiment, FIG. 2 is a sectional side view for illustrating a cut groove forming step in the workpiece dividing method according to the preferred embodiment, and FIG. 3 is a sectional side view for illustrating a laser cutting step in the workpiece dividing method according to the preferred embodiment. As shown in FIG. 1, the workpiece 1 is a platelike member and it is formed from a circular ceramic substrate of AlTiC, for example. A notch 1a is formed on the outer circumference of the workpiece 1.

A plurality of chips (devices) are formed on the front side 11 of the workpiece 1. A plurality of crossing division lines for dividing the workpiece 1 into the plural chips are formed on the front side 11 of the workpiece 1. The workpiece dividing method according to the preferred embodiment is a method of dividing the platelike workpiece 1 into the individual chips, and this method includes a workpiece preparing step, holding step, cut groove forming step, and laser cutting step.
(Workpiece Preparing Step)

The workpiece preparing step is a step of preparing the platelike workpiece 1, wherein at least one side of the workpiece 1 is formed as a mat surface. That is, at least one of the front side and the back side of the workpiece 1 is formed as a mat surface. The mat surface is a surface having a predetermined surface roughness. For example, the workpiece 1 is manufactured by burning, and the mat surface of the workpiece 1 is a surface not subjected to mirror finish. In this preferred embodiment, at least the front side 11 of the workpiece 1 is formed as a mat surface. As a modification, both of the front side 11 and the back side 14 of the workpiece 1 may be formed as mat surfaces.

As described above, the workpiece preparing step is a step of preparing the platelike workpiece 1 having a mat surface on at least one side. This step may include a step of forming devices on the workpiece 1, a step of processing the back side 14 of the workpiece 1, a step of forming a protective film on the front side 11 of the workpiece 1, and a step of setting the workpiece 1 into a cassette or the like of a cutting apparatus 30 (see FIG. 2).
(Cutting Apparatus)

As shown in FIG. 2, the workpiece 1 is held on a holding surface 21 of a chuck table 2 constituting the cutting apparatus 30. The cutting apparatus 30 includes the chuck table 2 and cutting means 4. The chuck table 2 functions to hold the workpiece 1 in cutting the workpiece 1 by using the cutting means 4. The holding surface 21 (upper surface) of the chuck table 2 is a circular portion formed of a porous ceramic material, for example. The chuck table 2 is connected through a vacuum line (not shown) to a vacuum source (not shown), thereby holding the back side 14 of the workpiece 1 on the holding surface 21 under suction.

The cutting means 4 functions to cut the workpiece 1 by rotating a cutting blade 42. The cutting means 4 includes a spindle housing 41, the cutting blade 42, and a spindle 43. The cutting blade 42 is fixed to the spindle 43 so as to be rotatable therewith. The spindle 43 is rotatably supported to the spindle housing 41. The spindle housing 41 contains a drive source, such as a motor, for rotationally driving the spindle 43. The cutting blade 42 is a very thin abrasive member having a substantially annular shape, and it is rotated to cut the workpiece 1. The thickness t of the cutting blade 42 is in the range of 40 to 10 μm, preferably 30 to 20 μm, for example.

The cutting apparatus 30 further includes a transporting mechanism for transporting the workpiece 1 to the holding surface 21 of the chuck table 2 and placing the workpiece 1 thereon, a Z-axis moving mechanism for relatively moving the chuck table 2 and the cutting means 4 in the direction (Z direction) perpendicular to the holding surface 21, an X-axis moving mechanism for relatively moving the chuck table 2 and the cutting means 4 in the X direction (the direction perpendicular to the sheet plane of FIG. 2), and a Y-axis moving mechanism for relatively moving the chuck table 2 and the cutting means 4 in the Y direction. In this preferred embodiment, the Z direction is a vertical direction and the workpiece 1 is placed on the holding surface 21 of the chuck table 2 in the condition where the front side 11 of the workpiece 1 is oriented upward in the vertical direction.

Both of the X direction and the Y direction are perpendicular to the Z direction. Further, the X direction and the Y direction intersect each other. In particular, the X direction and the Y direction are perpendicular to each other in this preferred embodiment. The cutting apparatus 30 further includes a Z-axis rotating mechanism for rotating the chuck table 2 about the Z axis. The workpiece 1 is placed on the holding surface 21 of the chuck table 2 so that the axis of rotation of the chuck table 2 coincides with the axis of the circular workpiece 1. The cutting apparatus 30 further includes a mechanism for recovering and transporting the workpiece 1 to the next stage after performing a cutting operation by the cutting apparatus 30. Prior to placing the workpiece 1 on the chuck table 2, a dicing tape 3 as an adhesive tape is attached to the back side 14 of the workpiece 1.
(Holding Step)

The holding step is a step of holding the workpiece 1 on the holding surface 21 of the chuck table 2 in the condition where the mat surface of the workpiece 1 is exposed. The transporting mechanism of the cutting apparatus 30 operates to transport the workpiece 1 set in a cassette or the like to the chuck table 2 and place the workpiece 1 on the chuck table 2 in the condition where the back side 14 of the workpiece 1 is opposed to the holding surface 21 through the dicing tape 3. In other words, the transporting mechanism of the cutting apparatus 30 operates to place the workpiece 1 on the chuck table 2 in the condition where the front side 11 (mat surface) of the workpiece 1 is exposed. Then, the back side 14 of the workpiece 1 is held under suction on the holding surface 21 of the chuck table 2 through the dicing tape 3.
(Alignment)

After holding the workpiece 1 on the holding surface 21 of the chuck table 2 as mentioned above, an alignment operation is performed. The alignment operation is an operation for aligning a predetermined one of the division lines of the workpiece 1 with the cutting blade 42. Since the front side 11 of the workpiece 1 is a mat surface in this preferred embodiment, a transmission microscope using infrared radiation is not allowed in performing the alignment operation. Accordingly, any means other than the transmission microscope using infrared radiation may be used to perform the alignment operation for the front side 11 of the workpiece 1. Alternatively, the alignment operation may be performed from the back side 14 of the workpiece 1. Further, the alignment operation may be performed according to the notch 1a formed on the outer circumference of the workpiece 1 or an orientation flat, for example. The cutting apparatus 30 operates to obtain alignment information and then adjust the relative positional relation between the workpiece 1 (the chuck table 2) and the cutting means 4 in the X and Y directions. The alignment information may be obtained by imaging the front side 11 of the workpiece 1 and processing an image obtained.

The cutting apparatus 30 next operates the X-axis moving mechanism, the Y-axis moving mechanism, and the Z-axis rotating mechanism according to the alignment information obtained above to change the relative positional relation between the chuck table 2 and the cutting means 4 in the X and Y directions, thereby positioning one end of the predetermined division line directly below the cutting blade 42. At this time, the alignment of the predetermined division line and the cutting blade 42 is made so that the predetermined division line extends in the X direction. Further, the cutting apparatus 30 operates the Z-axis moving mechanism to adjust the relative positional relation between the workpiece 1 and the cutting means 4 in the Z direction.

(Cut Groove Forming Step)

The cut groove forming step is a step of cutting the front side 11 (mat surface) of the workpiece 1 held on the holding surface 21 of the chuck table 2 by using the cutting blade 42 to thereby form a cut groove 12 with a remaining portion 15 having a predetermined thickness measured from the back side 14 of the workpiece 1. As shown in FIG. 2, the workpiece 1 is cut from the front side 11 thereof by using the cutting blade 42 of the cutting apparatus 30 to thereby form the cut groove 12. In order to form the cut groove 12 with the remaining portion 15 having a predetermined thickness measured from the back side 14 of the workpiece 1, the Z-axis moving mechanism of the cutting apparatus 30 is operated to preliminarily adjust the relative positional relation between the chuck table 2 and the cutting means 4 in the Z direction.

The depth d of the cut groove 12, i.e., the distance in the Z direction from the front side 11 of the workpiece 1 to the bottom of the cut groove 12 is set to the half or more of the thickness h of the workpiece 1. For example, the depth d of the cut groove 12 is set so that the thickness of the remaining portion 15 described hereinafter (which is equal to the value obtained by subtracting the depth d of the cut groove 12 from the thickness h of the workpiece 1) is less than or equal to 100 µm.

The X-axis moving mechanism of the cutting apparatus 30 is operated to relatively move the chuck table 2 and the cutting blade 42 in the X direction, thereby forming the cut groove 12 along the predetermined division line extending in the X direction. After finishing the formation of the cut groove 12 along the predetermined division line, the Y-axis moving mechanism of the cutting apparatus 30 is operated to relatively move the chuck table 2 and the cutting blade 42 in the Y direction, thereby aligning the cutting blade 42 with the next division line and then starting the formation of another cut groove 12. In this manner, the cutting apparatus 30 alternately performs the formation of the cut groove 12 and the alignment of the cutting blade 42 with the next division line, thereby sequentially forming a plurality of cut grooves 12 along all of the division lines extending in the X direction on the front side 11 of the workpiece 1.

After finishing the formation of the cut grooves 12 along all of the division lines extending in a first direction (X direction in this case), the Z-axis rotating mechanism of the cutting apparatus 30 is operated to rotate by 90° the chuck table 2 and then similarly perform the formation of a plurality of cut grooves 12 in a direction intersecting the previously formed cut grooves 12, e.g., along all of the division lines extending in a second direction perpendicular to the first direction. At the time of finishing the formation of the cut grooves 12 along all of the division lines extending in the second direction, the cut groove forming step is ended.

As described above, the cut groove forming step of the workpiece dividing method according to this preferred embodiment is performed by using the cutting blade 42 to cut the workpiece 1 from the front side 11 as a mat surface, thereby forming the cut grooves 12 on the front side 11 of the workpiece 1. Thus, the workpiece 1 is cut from the mat surface by the cutting blade 42, so that chipping possibly occurring in cutting the workpiece 1 can be suppressed by the irregularities on the mat surface. This is considered to be due to the fact that the occurrence itself of chipping is suppressed by the irregularities on the mat surface or that the enlargement of small chipping occurred is suppressed by the irregularities on the mat surface.

The surface roughness Ra of the mat surface of the workpiece 1 is preferably set in the range of 0.5 to 5.0 µm. The upper limit of the surface roughness Ra of the mat surface of the workpiece 1 is set more preferably to 3.0 µm. The surface roughness Ra (center-line average roughness) may be replaced by Rz (ten-point average roughness) or Rmax (maximum height). The front side 11 of the workpiece 1 may be preliminarily processed so as to have a desired surface roughness.

By suppressing the chipping as described above, the width of an area to be processed by the cutting blade 42 can be reduced. For example, as compared with the case of cutting the front side 11 as a mirror finished surface by using the cutting blade 42 to thereby form the cut grooves 12, the chipping can be suppressed to thereby reduce the width of an area to be processed. Accordingly, the width of an area required for the division of the workpiece 1 can be reduced according to the preferred embodiment. The workpiece 1 thus processed to form the cut grooves 12 by performing the cut groove forming step is next recovered from the chuck table 2 and transported to a laser processing apparatus 50 (see FIG. 3) by a transporting mechanism or the like (not shown).

(Laser Processing Apparatus)

As shown in FIG. 3, the laser processing apparatus 50 includes a chuck table 5 and laser processing means 6. For example, the chuck table 5 is similar to the chuck table 2 of the cutting apparatus 30 mentioned above. That is, the chuck table 5 has a holding surface 51 for holding the workpiece 1 thereon. The workpiece 1 is held on the holding surface 51 of the chuck table 5 in the condition where the front side 11 of the workpiece 1 is exposed.

The laser processing means 6 functions to apply a laser beam 7 to the workpiece 1 held on the chuck table 5. The laser processing means 6 includes a laser oscillator for oscillating the laser beam 7 and focusing means for applying the laser beam 7 oscillated by the laser oscillator to the front side 11 of the workpiece 1. The laser oscillator is capable of adjusting the frequency (wavelength) of the laser beam 7 to be oscillated. The laser oscillator functions to oscillate the laser beam 7 having an absorption wavelength to the workpiece 1. For example, a YAG laser oscillator or a YVO4 laser oscillator may be used as the laser oscillator. The focusing means includes a total reflection mirror for changing the traveling direction of the laser beam 7 oscillated by the laser oscillator and a focusing lens for focusing the laser beam 7 reflected on the total reflection mirror.

The laser processing apparatus 50 further includes a transporting mechanism for transporting the workpiece 1 to the holding surface 51 of the chuck table 5 and placing the wavelength 1 thereon, a Z'-axis moving mechanism for relatively moving the chuck table 5 and the laser processing means 6 in the Z' direction, an X'-axis moving mechanism for relatively moving the chuck table 5 and the laser processing means 6 in the X' direction (the direction perpendicular to the sheet plane of FIG. 3), and a Y'-axis moving mechanism for relatively moving the chuck table 5 and the laser processing means 6 in the Y' direction. The Z' direction is a direction perpendicular to the holding surface 51. In this preferred embodiment, the Z' direction is a vertical direction and the workpiece 1 is placed on the holding surface 51 of the chuck table 5 in the condition where the front side 11 of the workpiece 1 is oriented upward in the vertical direction.

Both of the X' direction and the Y' direction are perpendicular to the Z' direction. Further, the X' direction and the Y' direction intersect each other. In particular, the X' direction and the Y' direction are perpendicular to each other in this preferred embodiment. The laser processing apparatus 50 further includes a Z'-axis rotating mechanism for rotating the chuck table 5 about the Z' axis. The workpiece 1 is placed on the holding surface 51 of the chuck table 5 so that the axis of rotation of the chuck table 5 coincides with the axis of the circular workpiece 1. The laser processing apparatus 50 further includes a mechanism for recovering from the chuck table 5 transporting the workpiece 1 to the next stage after performing a laser processing operation by the laser processing apparatus 50.

(Laser Cutting Step)

The laser cutting step is a step of applying the laser beam 7 having an absorption wavelength to the workpiece 1 along the cut grooves 12 formed by the cut groove forming step, thereby cutting the remaining portion 15. Prior to performing this laser cutting step, the laser processing apparatus 50 operates to obtain alignment information for aligning a predetermined one of the cut grooves 12 (the division lines) of the workpiece 1 with the laser beam 7 to be applied by the laser processing means 6. The alignment information may be obtained by imaging the front side 11 of the workpiece 1 and processing an image obtained.

The laser processing apparatus 50 next operates the X'-axis moving mechanism, the Y'-axis moving mechanism, and the Z'-axis rotating mechanism according to the alignment information obtained above to change the relative position between the chuck table 5 and the laser processing means 6, thereby positioning one end of the predetermined division line (cut groove 12) directly below the focusing means of the laser processing means 6. At this time, the alignment of the predetermined division line and the focusing means is made so that the predetermined division line extends in the X' direction. Further, the Z'-axis moving mechanism of the laser processing apparatus 50 is operated to adjust the relative position between the workpiece 1 and the laser processing means 6 in the Z' direction, thereby setting the focal point of the laser beam 7 to be applied from the focusing means.

After finishing the alignment between the workpiece 1 and the laser processing means 6, the laser processing apparatus 50 starts the laser cutting step to apply the laser beam 7 from the laser processing means 6. At this time, the laser beam 7 is applied to the bottom of the predetermined cut groove 12, i.e., the upper end of the predetermined remaining portion 15. The X'-axis moving mechanism of the laser processing apparatus 50 is operated to relatively move the workpiece 1 (the chuck table 5) and the laser processing means 6 in the X' direction as applying the laser beam 7, thereby forming a laser processed groove 13 in the predetermined remaining portion 15. The laser processed groove 13 has a depth reaching the back side 14 of the workpiece 1. Accordingly, the predetermined remaining portion 15 is cut by this laser processed groove 13. That is, the workpiece 1 is divided into a portion located on one side of the laser processed groove 13 and a portion located on the other side of the laser processed groove 13 in the Y' direction. The cutting of the predetermined remaining portion 15 may be performed by applying the laser beam 7 in one pass or in plural passes.

As compared with the case of using the cutting blade 42 to fully cut the workpiece 1, chipping possibly occurring on the back side 14 of the workpiece 1 can be suppressed by performing the laser cutting step to cut the remaining portion 15. Further, the width of an area to be processed on the back side 14 can be reduced. In forming the laser processed groove 13, debris 8 is generated on the opposite sides of the laser processed groove 13. If the debris 8 generated is deposited to the front side 11 of the workpiece 1, the width of an area to be processed is increased.

In this preferred embodiment, however, the laser processed groove 13 is formed by applying the laser beam 7 to the bottom of the corresponding cut groove 12. Accordingly, the debris 8 generated by the formation of the laser processed groove 13 is deposited to the opposed side wall surfaces 12*a* and 12*b* of the cut groove 12. That is, the debris 8 generated in the laser cutting step is accommodated in the corresponding cut groove 12 and prevented from being exposed to the outside of the cut groove 12 (the front side 11 of the workpiece 1). Accordingly, the workpiece dividing method according to this preferred embodiment can prevent the problem that the debris 8 may be exposed to the front side 11 of the workpiece 1, thereby reducing the width of an area to be processed.

The depth d and the width w of the cut groove 12 are set so that at least a part of the debris 8 generated by the formation of the laser processed groove 13 can be accommodated in the corresponding cut groove 12 to thereby suppress the exposure of the debris 8 to the outside of the corresponding cut groove 12. In particular, the depth d and the width w may be set so that all of the debris 8 generated can be accommodated in the corresponding cut groove 12, in other words, so that the height of the debris 8 in the Z' direction is less than or equal to the depth d of the corresponding cut groove 12. Further, the focused spot diameter (Y' direction) of the laser beam 7 to be applied by the laser processing means is set smaller than the width w of the corresponding cut groove 12.

After finishing the formation of the laser processed groove 13 along the predetermined division line extending in the first direction, the Y'-axis moving mechanism of the laser processing apparatus 50 is operated to relatively move the chuck table 5 and the laser processing means 6 in the Y' direction, thereby aligning the laser processing means 6 with the next division line and then starting the formation of another laser processed groove 13. In this manner, the laser processing apparatus 50 alternately performs the formation of the laser processed groove 13 (cutting of the remaining portion 15 by the laser beam 7) and the alignment of the laser processing means 6 and the next division line, thereby sequentially cutting the remaining portions 15 along all of the division lines extending in the first direction.

After finishing the cutting of the remaining portions 15 along all of the division lines extending in the first direction, the Z'-axis rotating mechanism of the laser processing apparatus 50 is operated to rotate by 90° the chuck table 5 and then similarly cutting the remaining portions 15 in a direction intersecting the previously cut remaining portions 15, e.g., along all of the division lines extending in the second direction perpendicular to the first direction. At the time of finishing the cutting of the remaining portions 15 along all of the division lines extending in the second direction, the laser cutting step is ended.

After ending the laser cutting step, the workpiece 1 is recovered from the chuck table 5 and then subjected to a pickup step. In the pickup step, each chip 16 obtained by dividing the workpiece 1 in the laser cutting step is peeled from the dicing tape 3. As described above, the debris 8 is prevented from being exposed to the front side 11 of the workpiece 1 in this preferred embodiment. Accordingly, it is possible to prevent the problem that the debris 8 may be sucked by vacuum in the pickup step.

In the present invention, the workpiece is not limited to a ceramic substrate. For example, any inorganic material substrate other than the ceramic substrate and a semiconductor wafer such as a silicon wafer may be used as the workpiece in the present invention. In the case of a silicon wafer, the mat surface of the workpiece is a surface not subjected to processing such as grinding after cutting a silicon ingot.

While the cutting apparatus 30 and the laser processing apparatus 50 are separate apparatuses in this preferred embodiment, the cutting apparatus 30 and the laser processing apparatus 50 may be combined to configure an integral apparatus. The contents disclosed in this preferred embodiment may be suitably combined.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece dividing method for dividing a workpiece into a plurality of individual chips, said workpiece having a front side, a back side opposite the front side, and a plurality of crossing parallel division lines formed on the front side, said workpiece dividing method comprising:

a workpiece preparing step of preparing substantially said entire workpiece so that an irregular mat surface is formed on the front side of said workpiece; followed by a holding step of holding said workpiece on a holding surface of a chuck table in the condition where the back side of said workpiece is contacted with the holding surface of said chuck table and said mat surface of said workpiece is exposed; followed by a cut groove forming step of cutting said mat surface of said workpiece along the division lines after said workpiece is held on said holding surface of said chuck table by using a cutting blade to thereby form a cut groove extending from the front side towards the back side to a remaining portion having a predetermined thickness measured from the back side of said workpiece; followed by a laser cutting step of applying a laser beam having an absorption wavelength to said workpiece from the front side along said cut groove formed by said cut groove forming step to thereby cut entirely through the predetermined thickness of said remaining portion;

whereby chipping occurring in cutting the front side of said workpiece by using said cutting blade is suppressed by said mat surface; and debris generated in said laser cutting step is accommodated in said cut groove to suppress the exposure of said debris to the front side of said workpiece.

2. The workpiece dividing method according to claim 1, wherein a surface roughness Ra of said mat surface of said workpiece is set in the range of 0.5 to 5.0 μm.

* * * * *